United States Patent [19]
Peng et al.

[11] Patent Number: 5,787,190
[45] Date of Patent: Jul. 28, 1998

[54] METHOD AND APPARATUS FOR PATTERN RECOGNITION OF WAFER TEST BINS

[75] Inventors: Yeng-Kaung Peng, Saratoga; Siu-May Ho; Ying Shiau, both of San Jose, all of Calif.

[73] Assignee: Advanced Micro Devices, Inc., Sunnyvale, Calif.

[21] Appl. No.: 884,316

[22] Filed: Jun. 27, 1997

Related U.S. Application Data

[63] Continuation of Ser. No. 488,072, Jun. 7, 1995, abandoned.

[51] Int. Cl.$^6$ .................................................. H01L 21/66
[52] U.S. Cl. ............................ 382/145; 438/10; 438/17
[58] Field of Search ........................... 438/5, 6, 7, 8, 438/9, 10, 11, 12, 13, 14, 15, 16, 17, 18, 141, 142; 382/148, 149, 227, 225, 159, 160, 144, 145; 364/490

[56] References Cited

U.S. PATENT DOCUMENTS

| | | | |
|---|---|---|---|
| 5,159,752 | 11/1992 | Mahant-Shetti et al. | 29/846 |
| 5,219,765 | 6/1993 | Yoshida et al. | 437/8 |
| 5,240,866 | 8/1993 | Friedman et al. | 437/8 |
| 5,563,702 | 10/1996 | Emery et al. | 356/73 |
| 5,665,609 | 9/1997 | Mori | 438/16 |

OTHER PUBLICATIONS

Tadao Takeda, Methodology of Process Evaluation with Wafler-Mapping Techniques for Statistical Process Control, Proc. IEEE, pp. 85-89, Mar. 1994.

Ken Radigan et al., Using Full Wafer Defect Maps as Process Signatures to Monitor and Control Yield, IEEE Publication, pp. 129-135, Apr. 1991.

Dave Wilson et al., Automatic In–Line to End–of–Line Defect Correlation Using FSRAM Test Structure for Quick Killer Defect Identification, Proc. IEEE, pp. 160-163, Mar. 1994.

Dave Wilson et al., Automatic In–Line Measurement for the Identification of Killer Defects, IEEE Publication, pp. May 1-8, 1994.

Primary Examiner—Joseph Mancuso
Assistant Examiner—Brian P. Werner
Attorney, Agent, or Firm—Fenwick & West LLP

[57] ABSTRACT

An automated system and procedure processes wafer test bin data of semiconductor wafers to formulate a fault pattern at statistically significant levels. A processor such as a neural engine or neural network collects wafer test bin results to generate a N/N wafer map to be correlated with wafer maps produced from a wafer electrical test, a wafer level reliability test, and an in-line defect analysis. A N/N wafer map generated by the processor is cross-checked with a wafer map generated from another semiconductor tester to formulate possible overlap fault patterns. The confirmed fault patterns are further analyzed by performing failure analysis to find the root cause of fault patterns. A report containing fault patterns and the root cause for fault patterns is sent back to a fab for making adjustment to the fabrication process to increase the overall yield of the future batch of semiconductor wafers. The report is also stored in a pattern database to serve as a library for future reference of previously recognized fault patterns, thereby to bypass the need to perform a failure analysis for matching fault patterns.

3 Claims, 8 Drawing Sheets

ProductName: Dinosaur
LotNumber: C042709
WaferNumber: 1
FlatOrientation: Bottom

ProductName: Dinosaur
LotNumber: C037007
WaferNumber: 23
FlatOrientation: Bottom

METHOD AND APPARATUS FOR PATTERN RECOGNITION OF WAFER TEST BINS

RELATED APPLICATIONS

This is a continuation of application Ser. No. 08/488,072 filed on Jun. 7, 1995, now abandoned.

BACKGROUND OF THE INVENTION

1. Field of Invention

The present invention relates to the field of semiconductor manufacturing and more particularly to pattern recognition of manufacturing faults on semiconductor wafers.

2. Description of Background Art

Semiconductor wafer fabrication involves complex manufacturing processes to produce integrated circuits on the surface of silicon wafers. In order to characterize the quality of a wafer, each die is associated with a wafer test bin containing an alphanumeric code that represents the type of functional and non-functional die. The collective wafer test bins are grouped to generate a bin summary or a wafer map showing the locations of faulty dice and the type of manufacturing faults associated with these dice.

A goal of semiconductor manufacturing is to attain a high yield rate from all wafers during the device life time. Generally, random fault patterns do not provide information on the manufacturing process that can be used to enhance the yield. Conversely, uniform or non-random fault patterns serve as a guide to provide valuable feedback to a fab for identifying the sources of faults. However, large volumes of wafers are manufactured everyday wherein each wafer contains its own bin summary. Management of the large volumes of bin summaries is critical to identifying manufacturing faults and providing effective modifications of the manufacturing process.

Conventional fault tracking methods rely on an "eyeball" technique, in which an experienced semiconductor process engineer, manually examines selected sample wafers and makes his best judgment as to the cause of the faults. This "eyeball" technique is limited because the analysis is done only on selected sample wafers. Even if the process engineer manually observes each wafer for fault patterns, the sheer volume of wafers that are manufactured daily makes it a paramount task for the process engineer to review all of the wafers. This manual technique is not only labor intensive, but it is also time consuming to check selected sample wafers, and provides no data storage for correlating with future test data.

Accordingly, it is desirable to produce a method for automating the wafer test bin in processing of manufacturing faults on semiconductor wafers to generate a representative wafer map showing meaningful fault patterns.

SUMMARY OF THE INVENTION

The present invention is a method and an apparatus for automating the analysis of manufacturing faults on semiconductor wafers. This automation process allows systematic and efficient management of large volumes of wafers containing manufacturing faults. The automation process uses a neural network to generate a neural network (N/N) wafer map to correlate with wafer maps produced by a wafer electrical parametric tester (WET), a wafer level reliability tester (WLR), and an in-line defect tester.

A N/N wafer map is generated from a neural network representing fault patterns from at least one wafer. The N/N wafer map shows any dominant or secondary fault patterns clustered in a recognized geometric dimension. These dominant or secondary fault patterns are a collection of bin summaries from wafer test bin results, which are then correlated with the wafer map, the WLR wafer map, and the defect wafer map. These wafer maps, including N/N, WET, WLR, and WET, represent the faults on single wafer or a composite of at least one wafer lot.

WET wafer maps produce testing results to form possible fault patterns detected in verifying an electrical test structure on scribe lines. WLR wafer maps show any fault patterns, if any, found in verifying a wafer level reliability test structure on scribe lines. Defect wafer maps show memory or logic defects on partitioned in-process layers, such as film deposition, etching, lithography, and diffusion layers. Fault patterns on the N/N wafer map are correlated with any wafer maps generated from WET, WLR, and defect tests. A data analysis may show an overlap between fault patterns on the N/N wafer map and any of these other wafer maps to confirm the likely concentration of fault patterns on a wafer.

The fault patterns on an overlapped wafer map are further tested by failure analysis, which includes electronic scanning of the wafer materials at detected faulty locations. The purpose of the failure analysis is to reveal the root cause of manufacturing faults on semiconductor wafers. The confirmed test pattern results, which include root cause for detected faults, are stored in a database as a central library containing the collective wafer bin test results. The library generates a report containing any recognizable fault patterns, such as "donut", linear variation, concentric ring, edge, and reticle fault patterns. This report is used by a fab to adjust the manufacturing process to increase the overall yield for manufacturing of wafers.

BRIEF DESCRIPTION OF THE DRAWINGS

FIGS. 3a–b are illustrations of, respectively, a "donut" fault pattern before processing through a neural network, and the fault pattern detected after processing through a neural network.

FIGS. 3c–d are illustrations of, respectively, an "edge" fault pattern before processing through a neural network, and the fault pattern detected after processing through a neural network.

DESCRIPTION OF THE PREFERRED EMBODIMENT

Figure 1:
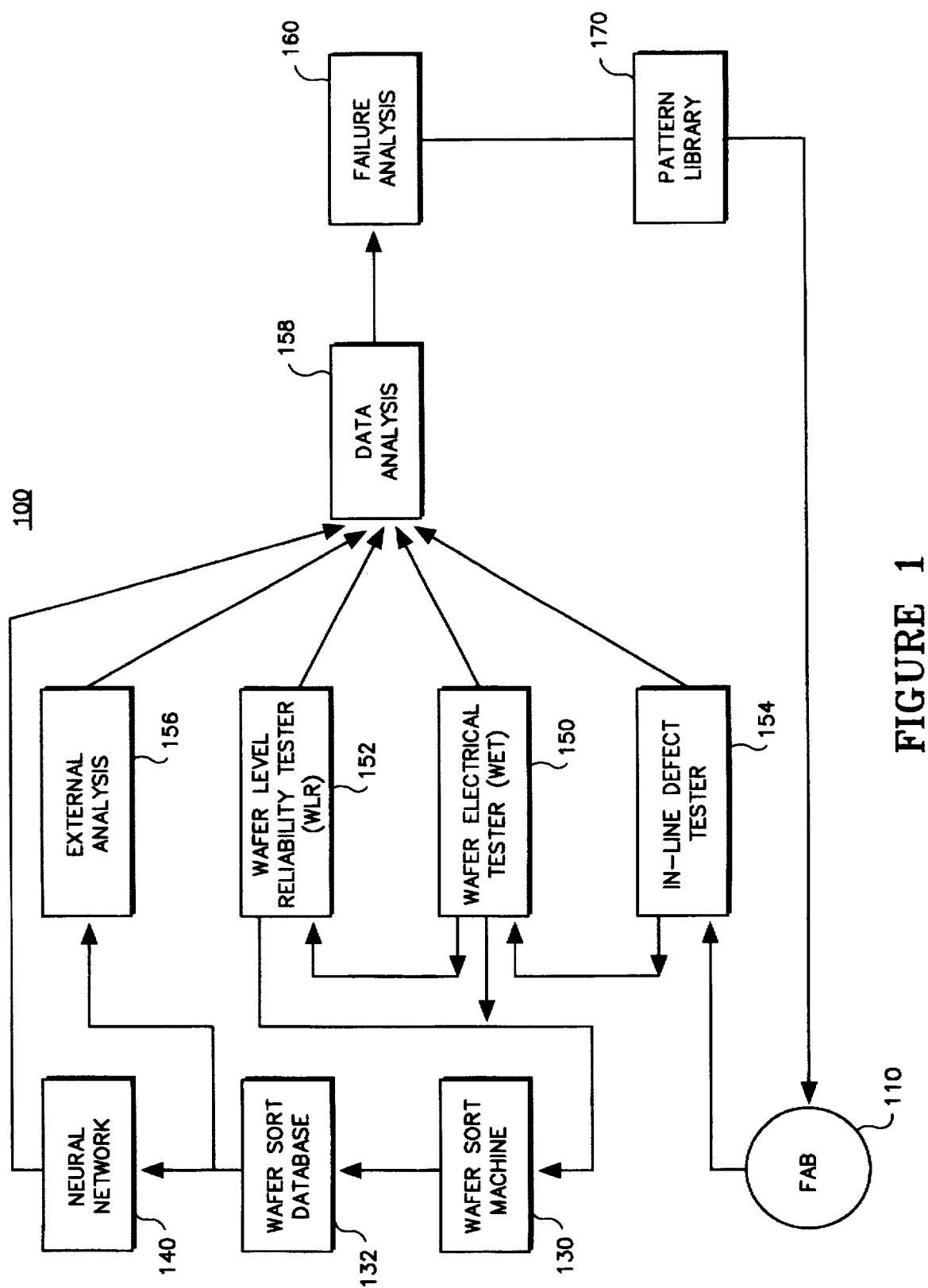
FIG. 1 is a block diagram of the fault pattern recognition system of the present invention.

Referring now to FIG. 1, there is shown a block diagram of the system of the present invention. The system 100 includes a fab 110, a wafer sort machine 130, a wafer sort database 132, a neural network 140, a wafer electrical tester (WET) 150, a wafer level reliability tester (WLR) 152, an in-line defect tester 154, an external analysis 156, a data analysis 158, a failure analysis 160, and a pattern library 170. The fab 110 is a semiconductor fabrication plant which manufactures integrated circuits on semiconductor wafers. An example of such a fab is the Submicron Development Center fab of Advanced Micro Devices, Inc., of Sunnyvale, Calif. The wafer sort machine 130 sorts wafers by individual wafer or by wafer lot, and tests the functionality of each die on semiconductor wafers to detect faults, and generates a composite or a single wafer map containing a bin summary for each wafer showing where the locations of detected faulty dice or where the locations of functional dice. A suitable wafer sort machine 130 such as J971 is commercially available from Teradyne of Agoura Hill, Calif. The wafer sort database 132 stores the bin summary of the die coordinate of a wafer specifying the faulty dice and functional dice found on the x-y coordinate of the wafer and loads the bin summary information to the neural network 140. The neural network 140 recognizes common fault patterns on semiconductor wafers by individual wafer or by wafer lot to produce a N/N wafer map representing functional and non-functional dice on a wafer or from a wafer lot, such neural networks are commercially available from DYM of Bedford, Mass. A N/N wafer map may be defined as a representative wafer map generated from a neural network identifying the manufacturing faults found from at least one wafer lot where such representation may be classified by a single wafer test bin alphanumeric code or by at least one wafer lot.

Testers 150, 152, and 154 are semiconductor test equipment that apply a different set of test criteria to semiconductor wafers to produce another representative wafer map. The in-line defect tester 154 tests for memory or logic defects on a die during the manufacturing process to generate a representative wafer map illustrating defective die pattern on that semiconductor wafer. WET tester 150 performs component tests to verify the electrical test structure on scribe lines. Similar to WET tester 150, WLR tester 152 verifies the wafer level reliability test structure on scribe lines of a wafer. Both WET tester 150 and WLR tester 152 verify the area on the wafers that are between the outer boundaries of dice. The wafer sort machine 130 verifies the functionality of a wafer. Moreover, an external analysis 156 by an experienced semiconductor process engineer spots fault patterns on a sample wafer by visual inspection.

A data analysis 158 determines if there exists an overlap of fault patterns generated from the neural network 140 and wafer maps produced by testers 150, 152, and 154. In addition, a failure analysis 160 performs further tests on the wafers to find the root cause of faults on the wafer, such as layer strip back, hot spot, chemical analysis, and cross section analysis. The result of the failure analysis 160 is loaded to a pattern library 170 for data storage and for comparison with other previously stored relevant data. The pattern library 170 generates a report containing the fault patterns and root cause for faults associated with a particular wafer lot. The report is submitted to the fab 110 and used to adjust the fabrication process in system 100 to increase the yields for manufacturing of the next wafer lot.

Figure 2:
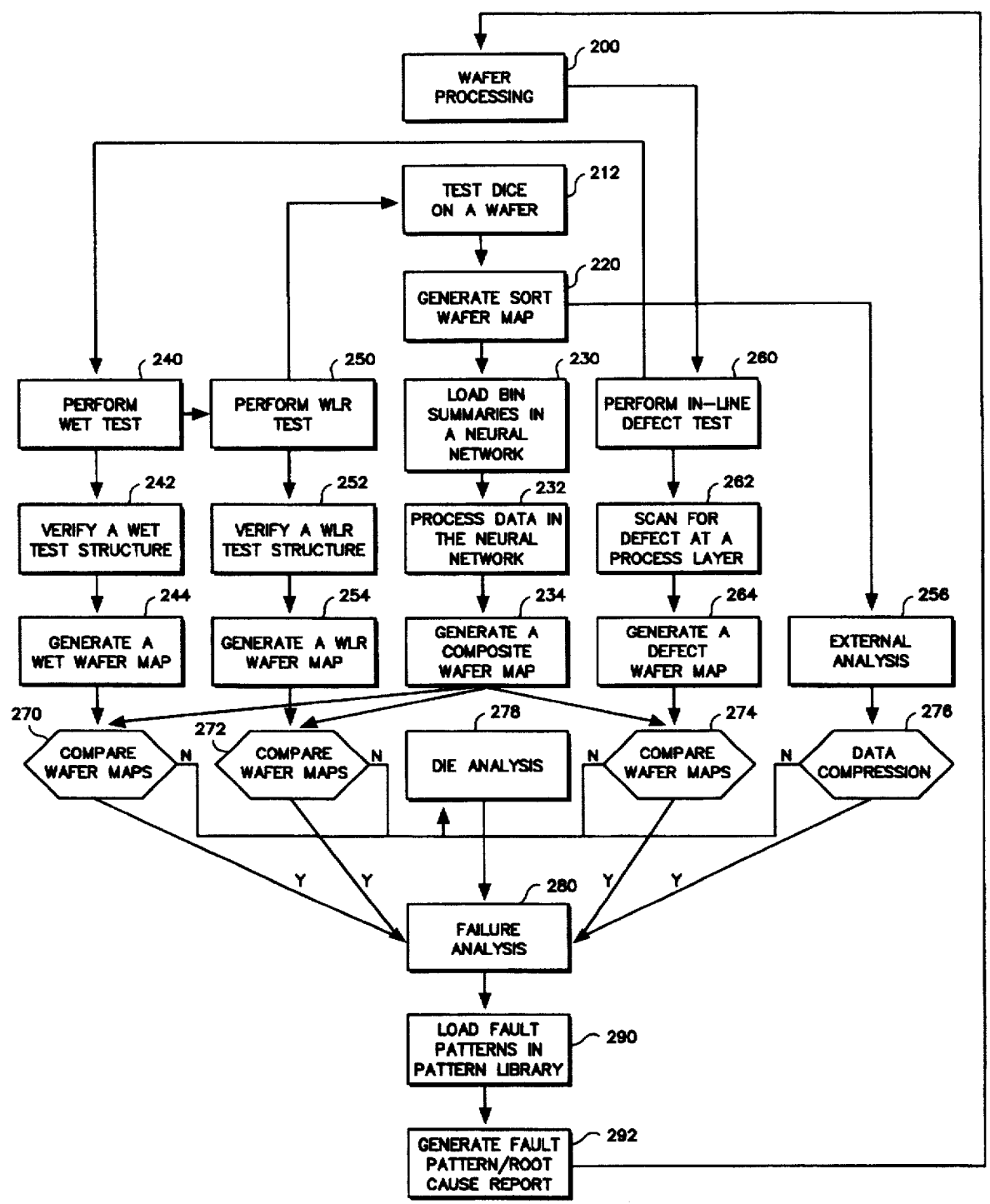
FIG. 2 is a flowgraph of the fault pattern recognition method of the present invention.

Referring now to FIG. 2, there is shown a flowgraph of the overall process of pattern recognition in processing wafer test bins on semiconductor wafers. Initially, a wafer lot of conductor wafers is fabricated 200 from the fab 110 containing a matrix of dice on its front surface of wafers. Each die contains integrated circuits. During the manufacturing process, the in-process layer of a wafer may be verified by an in-line defect test 260 to generate a defect wafer map 264. Defect wafer map 264 represents a conventional in-line defect testing for defects found on a particular in-process layer 262 of a wafer. Process layers include film deposition, lithography, etching, and diffusion. This process further described below with reference to FIG. 6. A defect wafer map 264 may be generated for each in-process layer to show the defective memory or logic at that in-process layer during the manufacturing of wafers.

The front surface of the wafers are tested 212 by wafer sort machine 130 in a series of test sequence to detect any faults within a die. Each test sequence is characterized by an alphanumeric code assigned to a particular type of test and the wafer sort machine 130 carries out the test sequence in an incremental order. The test sequence is aborted once a fault is detected on a die, at which time an alphanumeric code corresponding to the performed test is assigned to that die. The following table illustrates an example of a set of test sequence, comprising where a power supply short test, followed by an open test, and so on, until all tests are successfully completed, or a fault is detected to abort the test.

| Test Bin Sequence | Description |
| --- | --- |
| 1 | Power Supply Shorts Test |
| 2 | Open Test |
| 3 | Shorts Test |
| 4 | Initial Vcc Test |
| 5 | Functional Vcc Test |
| 6 | Static Icc Test |
| 7 | Dynamic Icc Test |
| 8 | Output Leakage Test |
| 9 | Input Leakage Test |
| 10 | Vout @ Vccmax Test |
| 11 | Vout @ Vccmin Test |
| 12 | Vil Test |
| 13 | Vih Test |
| 14 | Good Bin |

A bin summary is generated 220 for each semiconductor wafer which includes a matrix of test bin alphanumeric codes assigned to die locations across the x-y plane of the wafer. Bin summaries are stored in the wafer sort database 132 for collecting the functionality test result from each semiconductor wafer. The collective bin summaries are loaded 230 to the neural network 140. The bin summaries are processed 232 through the neural network 140 for classifying different categories of faults. A N/N wafer map is generated 234 from the neural network 140 to represent the dominant and the secondary fault patterns for at least one wafer lot. A dominant fault pattern shows a clear illustration of a fault pattern while a secondary fault pattern indicates a possible clustering of fault patterns. A fault pattern that occurs at a frequency rate among the total sampled wafers are determined by an engineer as to what would constitute sufficient high percentage of faults to formulate a dominate or a secondary fault pattern.

In addition to the N/N wafer map which contains manufacturing faults at the functionality level and the defect wafer map, two additional sets of test, which need not be performed in sequence, are further performed on wafers to generate a WET wafer map 244, a WLR wafer map 254. A map as used herein is a mirror image to a physical wafer illustrated in a recorded medium to show faults detected on that wafer. These two tests and the in-line defect test contain their own independent wafer map for correlating with the N/N wafer map produced from the neural network 140.

WET wafer map 244 represents a conventional test sequence performed 240 on a WET test structure 242 on scribe lines between the dice on wafers. An electrical test structure is defined as one of the components that are configured on a die. An example of WET test includes threshold voltage, drive current, breakdown voltage, and off-state leakage current on a single transistor. This process is more fully described below with reference to FIG. 7.

Figure 8:
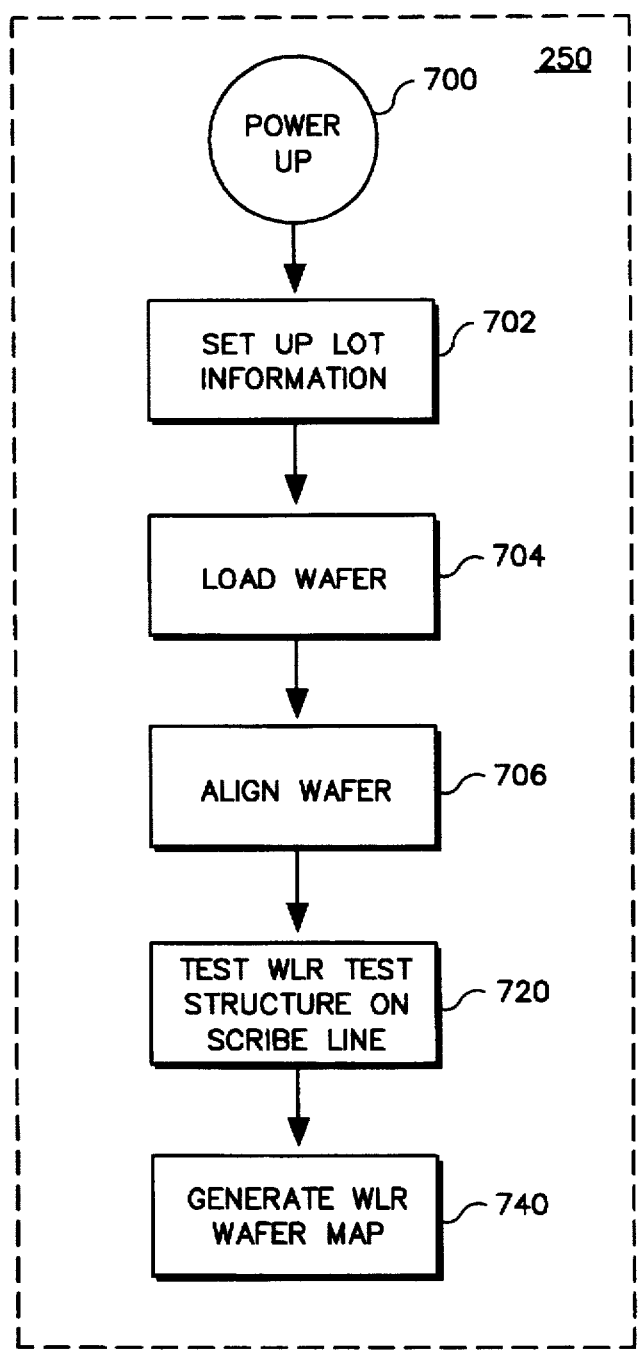
FIG. 8 is a flowgraph of the process for generating a wafer map from a wafer level reliability tester.

WLR wafer map 254 shows another conventional test sequence performed 250 on a WLR test structure 252 on scribe lines of the dice on a sample wafer. The different types of WLR tests are independent of one and another so that it is not necessary to carry out the test in a specific sequence. Further description of this process is shown in FIG. 8. Examples of different WLR tests include: gate oxide breakdown, charge trapping, electromigration test on metallization, and hot carrier injection (HCI).

In addition to wafer maps generated from other testers to verify fault patterns, another source of cross-checking is shown from an external analysis 256, which includes a semiconductor process engineer performing a visual inspection to identify 276 a fault pattern on a wafer, notably fault patterns arising from a stepper, a film deposition, or an etching pattern.

Wafer map comparison steps 270,272, and 274 overlay a fault pattern on N/N wafer map with a fault pattern on wafer maps from WET, WLR, and in-line defect tester respectively. The fault pattern on a wafer map from one of the testers 150, 152, and 154 is superimposed to the fault pattern on the N/N wafer map generated from the neural network 140 to determine dependency. Dependency exists if one fault pattern on a N/N wafer map is substantially related to the fault pattern on another wafer map, which would establish a confirmed fault pattern. If the wafer map comparison 270, 272, and 274 results are inconclusive, a die analysis 278 is performed, such as a hot spot measurement, on a selected die with typical failure as an alternative technique to find the cause of fault on that die. In addition, an external analysis 256 performed by an engineer to visually inspect the wafer sort map 220 to observe for any constructed fault patterns.

After the various wafer maps have been correlated to determine an overlap pattern, the failure analysis 280 microscopically probes into the fault locations to find the root chemical or physical cause of a pattern fault. For example, if a die failed a static Icc test due to exceedingly high current drawn by an area on the die, the failure analysis 280 performs hot spot identification which applies electrical current to the die and uses a conventional analytical machine, such an emission microscope (EMMI), to detect the source of defect. Suitable root cause reports may be generated 292 for use in correcting wafer processing 200 in response to fault patterns loaded 290 into pattern libraries from the failure analysis 2800.

Figures 3A, 3C:
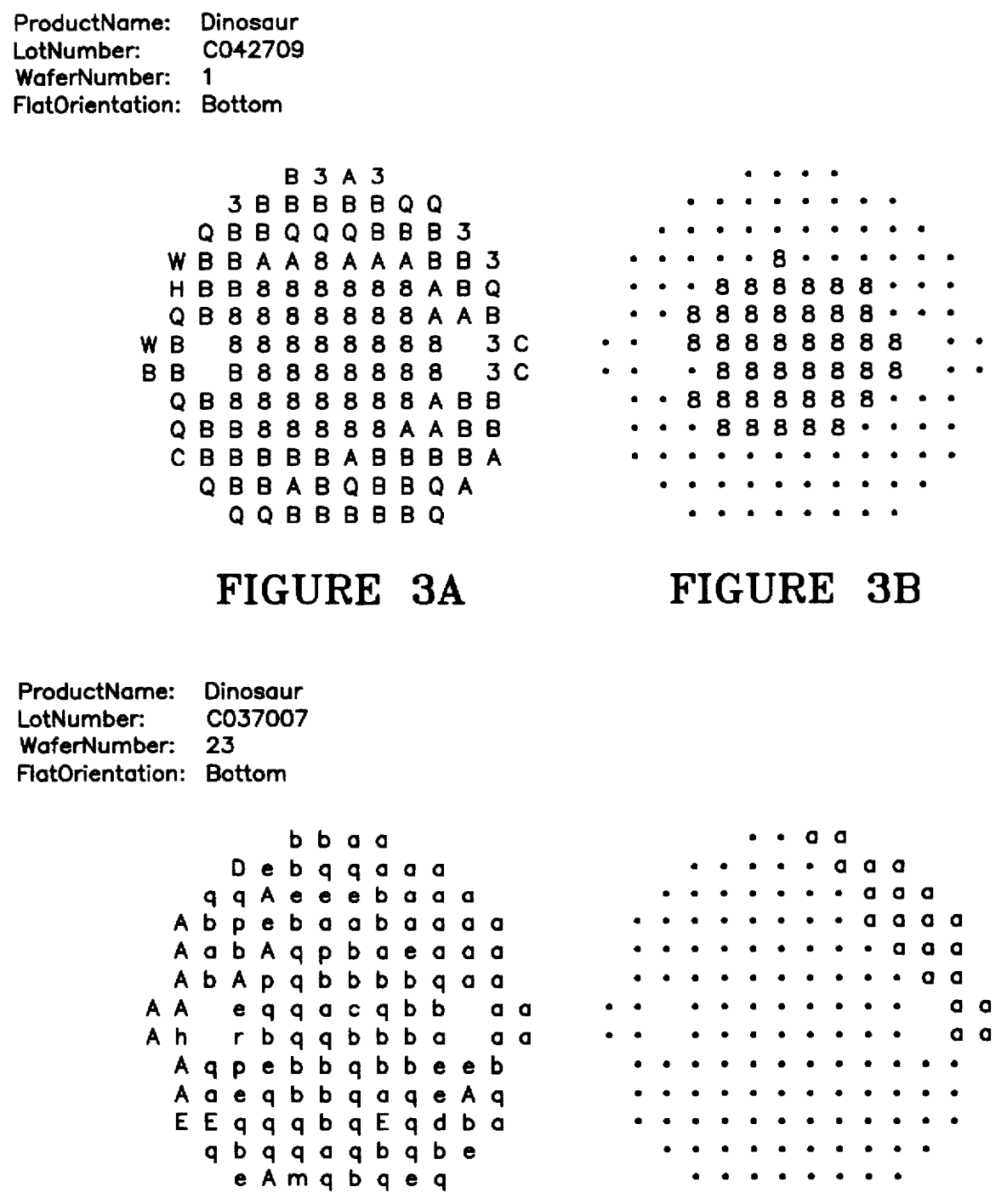

In FIGS. 3b and 3d, there are shown illustrative examples of common fault patterns observed on semiconductor wafers. FIG. 3b shows a "donut" shape fault pattern in which the faults are concentrated in a geometric area with functional dice on the outskirts of the "donut" hole. FIG. 3a is a wafer map generated from the wafer sort machine 130 containing all faults, if any, on a single or a composite wafer map. The extraneous data on the outskirts of FIG. 3a are filtered out by the neural network 140 to generate the map of FIG. 3b which only contains the "donut" fault pattern. FIG. 3d illustrates another type of fault pattern where faults are concentrated on an edge of a wafer. The map of FIG. 3c contains all faults, if any, detected by the wafer sort machine 130 prior to extraneous data being filtered out by the neural network 140.

Figure 4:
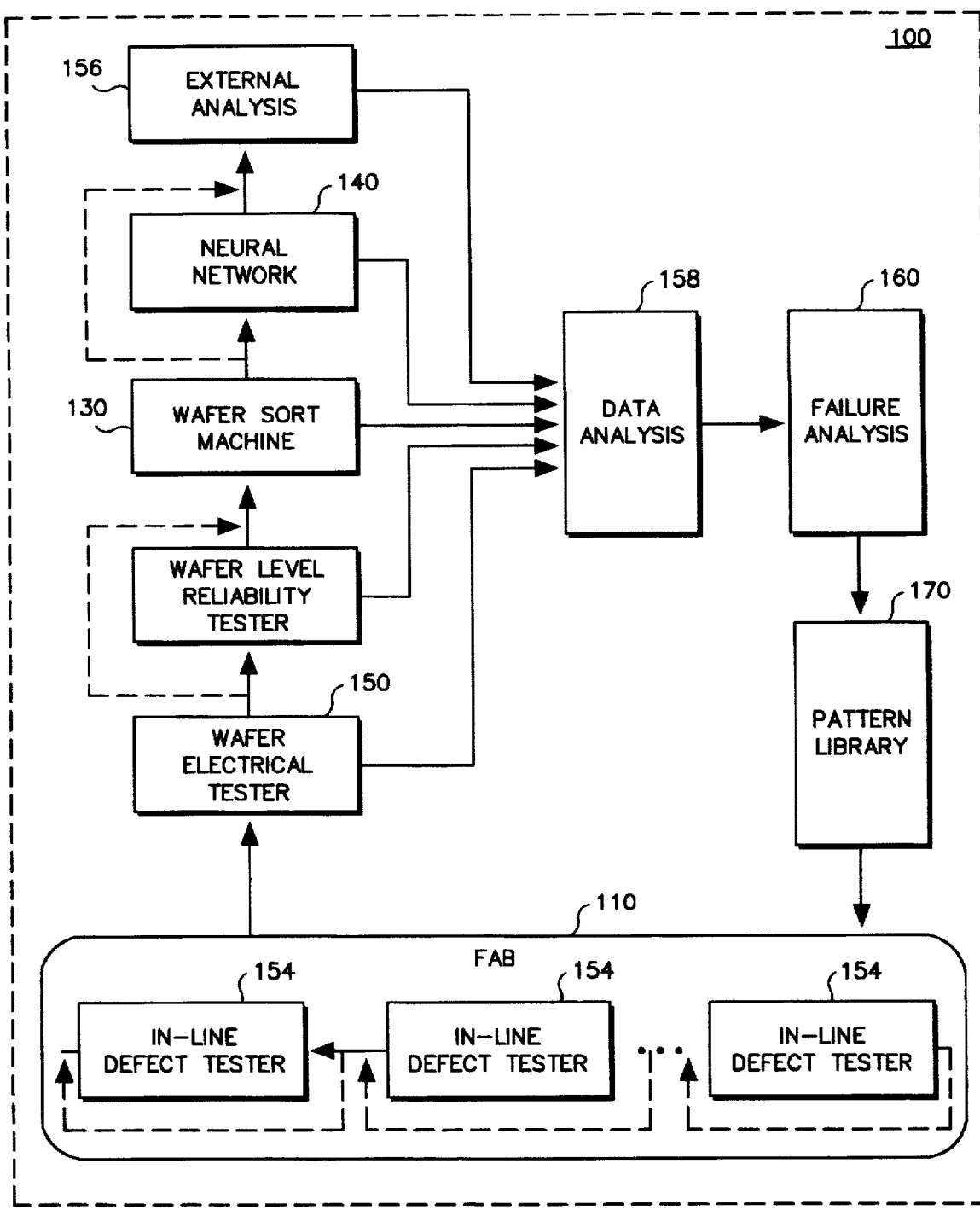
FIG. 4 is a block diagram of the preferred embodiment of the fault pattern recognition system of the present invention.

Referring now to FIG. 4, there is shown a block diagram illustrating a preferred embodiment of the present invention. As the fab 110 manufactures silicon wafers through each of the major process steps, the in-line defect testers 154 verify a partitioned in-process layer to generate a defect wafer map representing faults found at that process layer. There can be different type of in-line defect testers 154 placed in the fab 110 to perform tests at a particular process layer, such as film deposition, etching, lithography, and diffusion layers. An in-process layer need not be tested sequentially by the in-line defect testers 154, rather each layer may bypass any of the in-line defect testers 154. Manufactured wafers are sent to wafer electrical tester 150 to verify an electrical test structure on scribe lines which produce a WET wafer map. Selected sample manufactured wafers are then forwarded to the wafer level reliability tester 152 to generate a WLR wafer map from testing the reliability level of wafers. In addition, the manufactured wafers are transferred to the wafer sort machine 130 to test the functionality of the wafers to generate single or composite wafer maps. A single wafer map represents the test results of an individual wafer. A composite wafer map shows the test results of a wafer lot where a wafer lot is defined as a specified quantity of wafers processed at the same time from the beginning to the end of fabrication. Single wafer maps and composite wafer maps are converted to a coordinate system to feed the data into the neural network 140. The neural network 140 processes the data to filter out unwanted noise or random patterns to generate a N/N wafer map showing a meaningful fault pattern. Moreover, the results from wafer sort machine 130 may be directly transferred to external analysis 156 for further inspection. Here, the wafers are visually inspected by an engineer to identify any visually-recognizable fault patterns, such as faults arising from a stepper, a film deposition, or an etching pattern. The data analysis 158 compares a N/N wafer map from the neural network 140 to wafer maps from the in-line defect tester 154, the wafer electrical tester 150, and the wafer level reliability tester 152. In addition, the data analysis 158 collects results from the external analysis 156. If there exists a correlation between the fault pattern on the N/N wafer map and the fault pattern on another wafer map, the failure analysis 160 further conducts more in-depth tests to find the root cause of the fault pattern. The result of the failure analysis 160 is submitted to the pattern library 170 for generating a report to be send back to the fab 110 for modifying the manufacturing processes and for storage of information for future usage.

Figure 5:
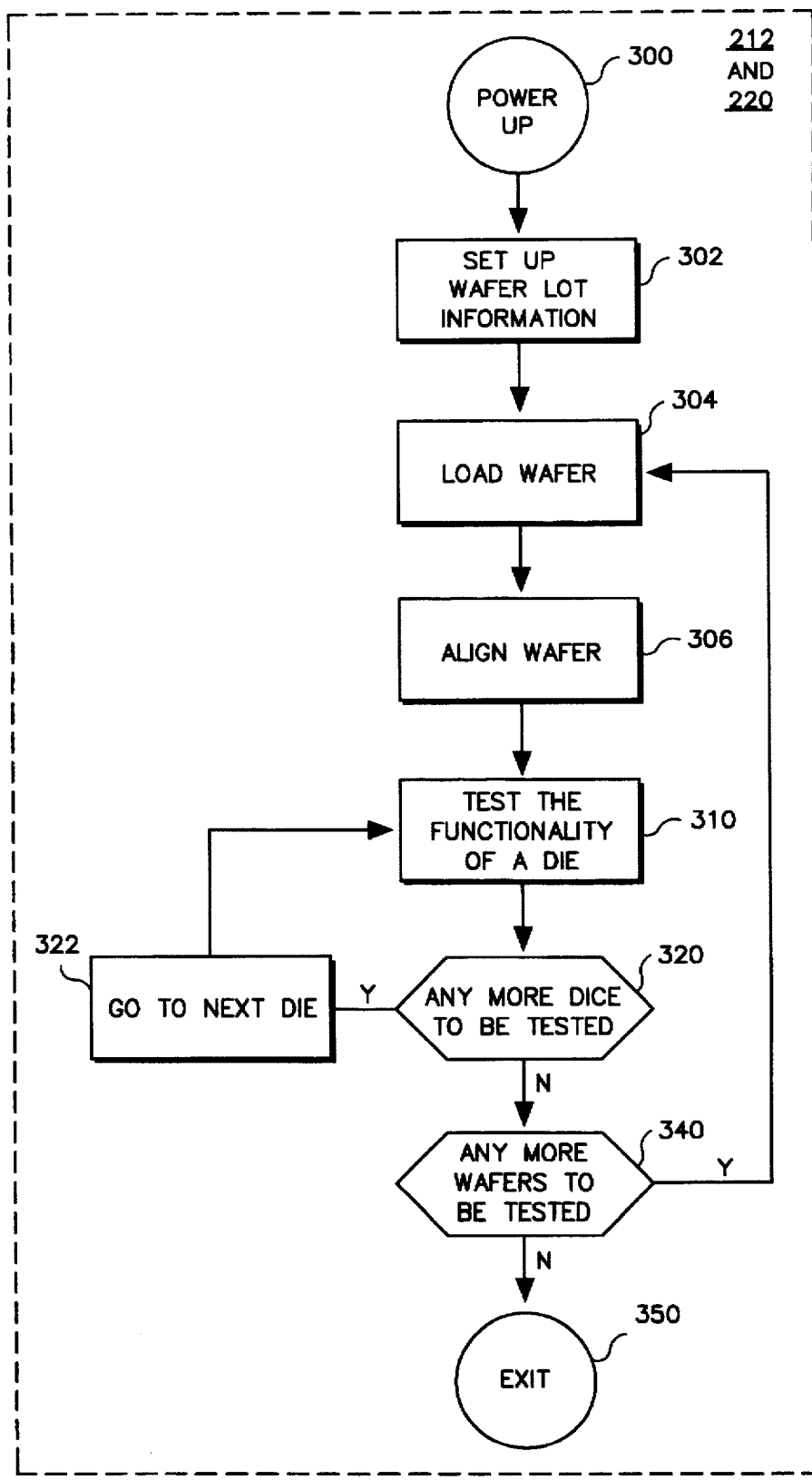
FIG. 5 is a flowgraph of the process for generating a wafer map from a wafer sort machine.

Referring now to FIG. 5, there is shown a flowgraph of the process for performing a wafer sort test on wafers. The wafer sort machine 130 tests the integrated circuits on each die of a wafer to verify that the functionality of the integrated circuits meets the requirements set forth in the product specification. Initially the wafer sort machine 300 is powered up and a wafer lot file is loaded 302 into the wafer sort machine 130 containing associated data for identifying the wafer lot and the information associated with the wafers. The wafers are then loaded 304 into the wafer sort machine 130 for testing the functionality of the wafers. Each wafer is then aligned 304 according to the orientation of that wafer so that the wafer sort machine 130 can correctly record the data at the corresponding fault locations. Each die on the wafer is tested 310 to verify if that die is or is not functional. This process continues 320 and 322 until all dice on that wafer have been verified. Then the next wafer is loaded 340 to the wafer sort machine 130 for the same functionality test. The wafer sort machine exits 350 this testing process until all wafers have been tested by the wafer sort machine 350.

Figure 6:
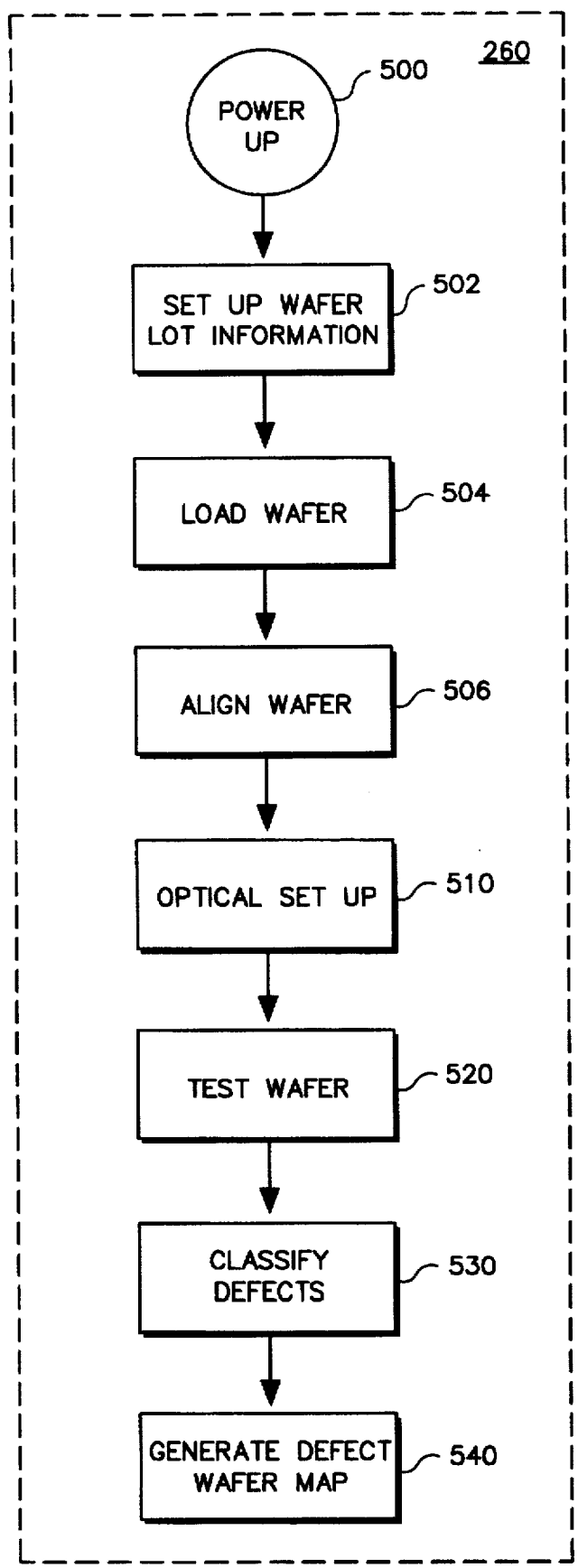
FIG. 6 is a flowgraph of the process for producing a wafer map from an in-line defect tester.

Referring now to FIG. 6, there is shown a flowgraph of the process for inspecting defects on wafers employing the in-line defect tester 154, as referred to in FIG. 1. The in-line defect tester 154 may be any type of semiconductor defect tester, such as the commercially available wafer inspection system from Inspex Corporation of Billerica, Mass. Inspection of wafers can be performed on different in-process layers to obtain a representative wafer map at each major process layer, including a film deposition layer, an etching layer, a lithography layer, and a diffusion layer. Therefore, the cause of a defect is more likely to be understood by isolating a wafer map to a particular layer on a wafer.

The in-line defect tester 154 is first powered up 500 to enter referencing information associated with that wafer, such as date and time, for file assignment. After a sample wafer is loaded 504 into the in-line defect tester 154, the wafer can be aligned 506 in two ways. A wafer can be aligned automatically by a pre-loaded software indicating the orientation and the geometric size of the wafer or aligned manually by pointing a mouse cursor on a computer display at three locations, the center, the left edge, and the right edge of the wafer. A conventional optical set up 510 allows the in-line defect tester 154 to detect for faults at each in-process level in which an optical is shot to fingerprint defect locations on the wafer without regard to die boundaries on the wafer.

A wafer file is set up 502 containing the characteristics of a particular wafer lot. The array is typically defined by the actual number of dice on a wafer. The array allows the in-line defect tester 154 to map the geometry in accordance with that wafer. The in-line defect tester 154 then inspects 520 the wafer to perform a single-die scan to detect for defects on that in-process layer. After completing the scan, the in-line defect tester 154 locates 530 the defects location for dice on a wafer. A wafer map is then generated 540 showing the detected defects across the surface of that wafer.

Figure 7:
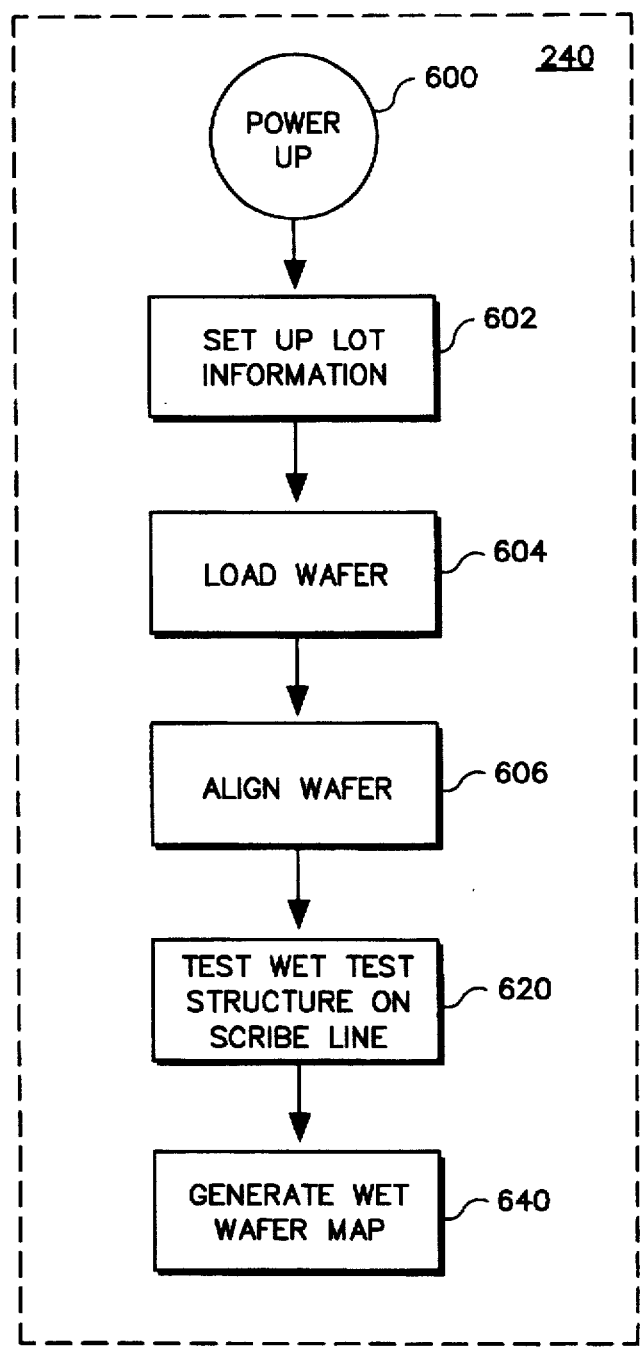
FIG. 7 is a flowgraph of the process for generating a wafer map from a wafer electrical tester.

In FIG. 7, there is shown a flowgraph of a conventional process for performing a WET test. Similarly to the preliminary procedures for the in-line defect tester 154, the wafer electrical tester 150 is powered up 600, set up wafer file information 602, load wafer 604, and align wafer 606. The wafer electrical tester 150 verifies 602 the electrical structure on scribe lines at selected sites on a wafer by attaching small probes to the contact pads. The result of faults detected at the selected sites forms 640 a WET wafer map for correlating with N/N wafer map.

Referring now to FIG. 8, there is shown a flowgraph of a conventional process for performing WLR test. During the initial steps, the wafer level reliability tester 152 performs the following functions: powered up 700, set up wafer file information 702, load wafer 704, and align wafer 706. WLR test structures are pre-fabricated on scribe lines of wafers during the manufacturing process for later reliability testing. The wafer level reliability tester 152 then verify 720 the long term reliability, such as metal to silicon ohmic contacts to generate 740 a WLR wafer map.

We claim:

1. A wafer test bin pattern recognition system for a fabrication facility for manufacturing a plurality of semiconductor wafers having plural circuit patterns formed as dice thereon, the system comprising:

a neural network processor linked to said fabrication facility for classifying a population of a plurality of fabricated semiconductor wafers by an identification code which denotes a particular fault for each non-functional die on the plurality of wafers for generating a first wafer map for the population of wafers indicating at least one fault pattern;

a semiconductor tester disposed to receive said plurality of wafers to generate a fault pattern for each of the plurality of wafers on a second wafer map for each wafer; and a data analyzer for correlating said fault pattern on said first wafer map with said fault patterns on each of said second wafer maps for producing a confirmed fault pattern indicative of corrections required in said fabrication facility.

2. A wafer test bin pattern recognition system for operation with a fabrication facility for manufacturing a plurality of semiconductor wafers, the system comprising:

a wafer tester linked to said fabrication facility to receive a population of a plurality of wafers for providing test data for each die and for identifying each of non-functional die on each of said plurality of wafers by an identifying code that represents a type of fault a processor including a neural network coupled to said wafer tester for processing the test data on the dice on each of the plurality of wafers in the population of wafers to generate a first wafer map of non-functional dice at wafer coordinates detected for each wafer;

a first analyzer coupled to receive the test data for each die to generate a second wafer map for each wafer of the population of wafers;

a second analyzer for analyzing fault patterns on said first wafer map overlapping fault patterns on each of said second wafer maps; and a data analyzer coupled to said second analyzer for producing an output indication of a confirmed fault pattern requiring correction of a process in said fabrication facility for manufacturing a subsequent population of wafers.

3. A method for operation of a wafer tester and neural network for selecting defect patterns in a population of fabricated semiconductor wafers from test data on dice on each wafer of the population as an indication of required fabrication corrections, the method comprising:

generating from the wafer tester a set of test data that contains a bin summary of a plurality of functional and non-functional dice on each wafer of the population of fabricated wafers, with each fault of a non-functional die being assigned a code designating the type of fault which said code represents;

forming a first wafer map for each wafer of the population of fabricated wafers from the set of test data generated from the wafer tester;

supplying the bin summaries for the population of fabricated wafers to the neural network to generate a representative wafer map including a pattern of a type of fault in non-functional dice on the population of fabricated wafers;

comparing the first map for each wafer with the representative wafer map from the population of fabricated wafers for a type of fault pattern; and selecting for a wafer a fault pattern in a first map overlapping with a pattern of a type of fault in the representative wafer map as an indication of fault for correction in subsequent fabrication of a population of wafers.

\* \* \* \* \*